(12) United States Patent
Lee

(10) Patent No.: US 7,691,738 B2
(45) Date of Patent: Apr. 6, 2010

(54) METAL LINE IN SEMICONDUCTOR DEVICE AND FABRICATING METHOD THEREOF

(75) Inventor: Hee-Bae Lee, Bucheon-Si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/254,019

(22) Filed: Oct. 20, 2008

(65) Prior Publication Data

US 2009/0108454 A1 Apr. 30, 2009

(30) Foreign Application Priority Data

Oct. 25, 2007 (KR) ...................... 10-2007-0107737

(51) Int. Cl.
*H01L 21/44* (2006.01)

(52) U.S. Cl. ................ 438/634; 438/672; 257/E21.575

(58) Field of Classification Search ......... 438/625–629, 438/631, 633–634, 672; 257/E21.575
See application file for complete search history.

(56) References Cited

U.S. PATENT DOCUMENTS 6,245,659 B1 * 6/2001 Ushiyama ................... 438/620

FOREIGN PATENT DOCUMENTS

KR 10-2005-0066823 6/2005

* cited by examiner

*Primary Examiner*—Thanhha Pham
(74) *Attorney, Agent, or Firm*—Sherr & Vaughn, PLLC

(57) ABSTRACT

A metal line in a semiconductor device and fabricating method thereof includes a first contact plug on a substrate, a first insulating interlayer over the substrate including the first contact plug, a first etch stop layer formed over the first insulating interlayer; a trench in the first insulating interlayer and the first etch stopper layer, a metal line in the trench, the metal line including a second contact plug projecting from the trench, wherein the metal line and the trench are formed as a single body, and a second insulating interlayer over the substrate including the metal line and the second contact plug.

11 Claims, 6 Drawing Sheets

METAL LINE IN SEMICONDUCTOR DEVICE AND FABRICATING METHOD THEREOF

The present application claims priority under 35 U.S.C. §119 to Korean Patent Application No. 10-2007-0107737 (filed on Oct. 25, 2007), which is hereby incorporated by reference in its entirety.

BACKGROUND

Generally, demands in semiconductor fabrication technology have focused on obtaining high integration. Accordingly, demands for a post process for forming multi-layer lines in a semiconductor device such as metal lines for connecting devices electrically together after forming transistors, bit-lines, capacitors and the like to accomplish a reduction in size, ultra-large size and ultra-high integration of the semiconductor device.

Figure 1A:
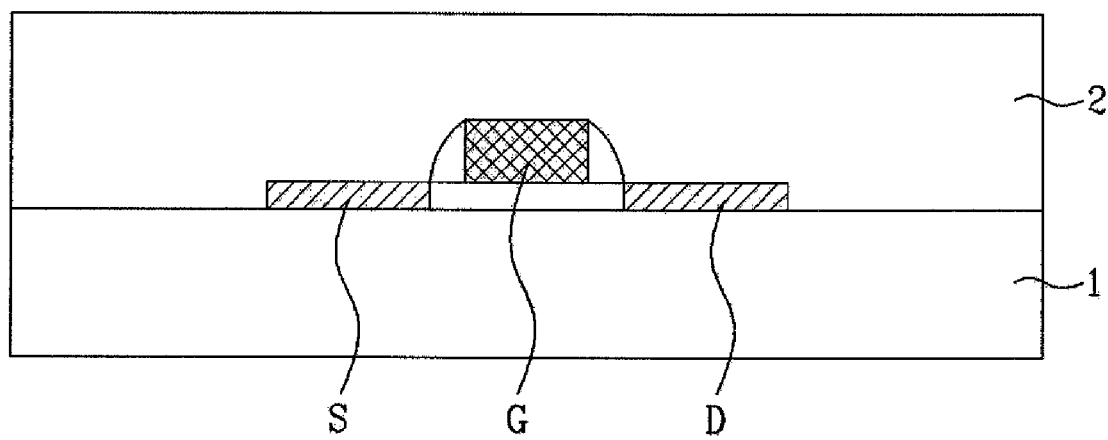

As illustrated in example FIG. 1A, in a metal line fabricating method in a semiconductor device, after a semiconductor device such as a photodiode, a transistor, a capacitor and the like has been formed on and/or over semiconductor substrate 1, protective layer 2 is formed on and/or over semiconductor substrate 1. In example drawing FIG. 1A, a MOS transistor including gate electrode G, source S and drain D is illustrated as a semiconductor device.

Figure 1B:
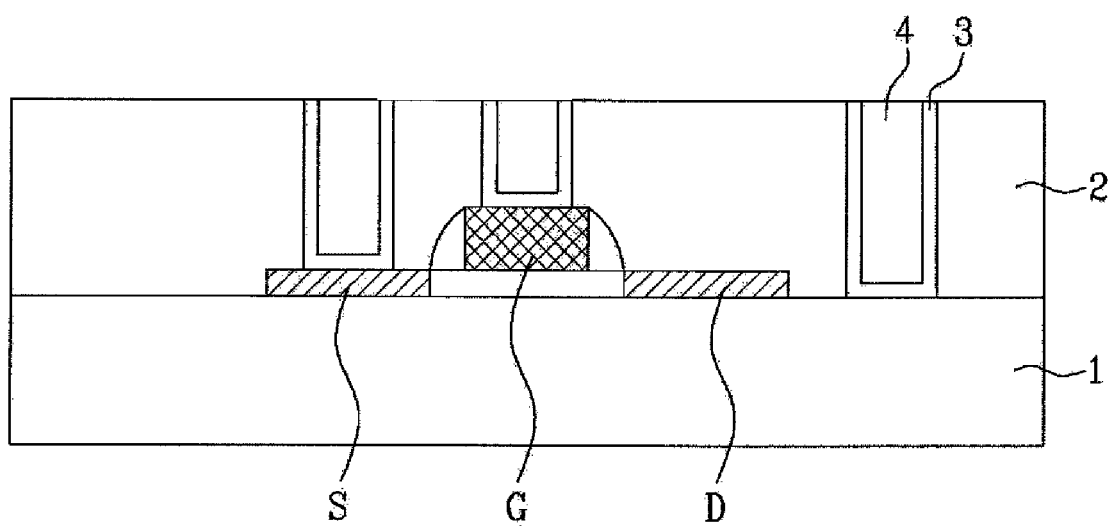

As illustrated in example FIG. 1B, the protective layer is selectively removed by photolithography to form contact holes. After barrier metal layer 3 and metal layer (e.g., tungsten layer) 4 have been formed on and/or over protective layer 2 to fill the contact holes, a first contact plug including barrier metal layer 3 and metal layer 4 stacked thereon and/or thereover is formed in each of the contact holes by CMP.

Figure 1C:
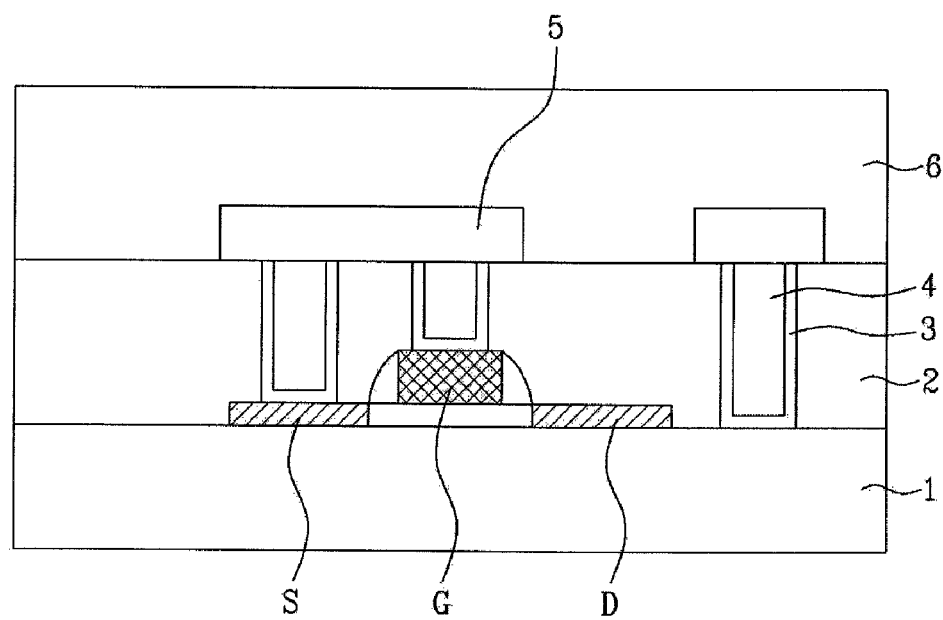

As illustrated in example FIG. 1C, a metal substance for forming a metal line is deposited on and/or over protective layer 2 and is then patterned to form first metal line 5 electrically connected to the first contact plug. Subsequently, first insulating interlayer 6 is formed on and/or over first metal line 5. A surface of first insulating interlayer 6 may be formed uneven due to a step difference of first metal line 5 beneath first insulating interlayer 6. To planarize first insulating interlayer 6, chemical mechanical polishing (CMP) can be performed.

Figure 1D:
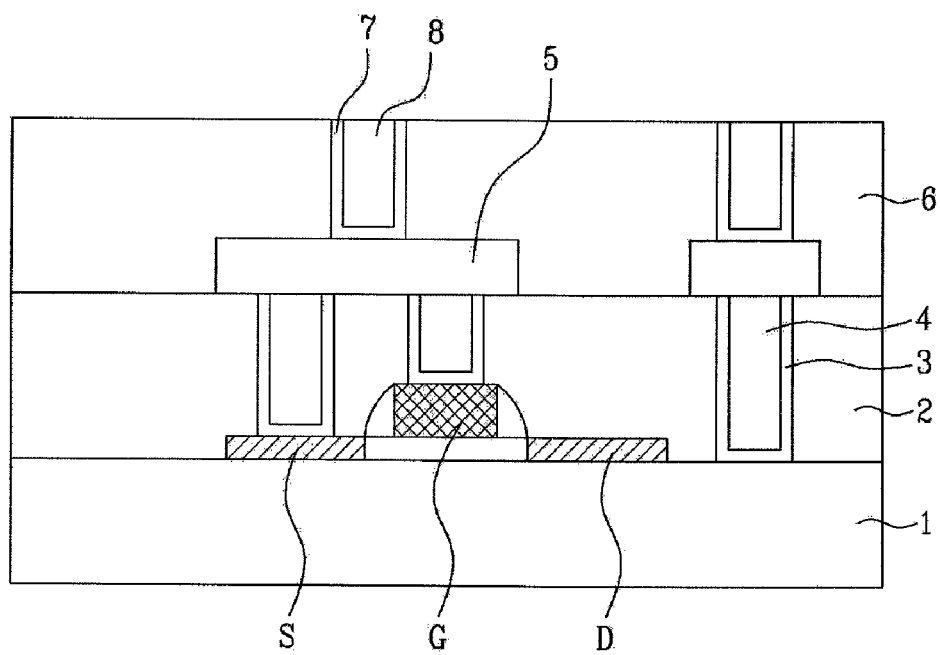

As illustrated in example FIG. 1D, contact holes are formed on and/or over first metal line 5 by selectively removing portions of first insulating interlayer 6 by photolithography. After barrier metal layer 7 and metal layer 8 have been formed on and/or over first insulating interlayer 6 to fill the contact holes formed in first insulating interlayer 6, a second contact plug including barrier metal layer 7 and metal layer 8 stacked thereon and/or thereover is formed in each of the contact holes by CMP. Subsequently, multi-layer metal lines are formed by repeating the above steps illustrated in example FIGS. 1C and 1D.

As mentioned in the above description, in forming the multi-layer metal lines of the semiconductor device, an insulating interlayer is deposited on and/or over a lower metal line, a contact hole is formed by selectively removing the insulating interlayer, a contact plug is formed within the contact hole, and an upper metal line is then formed thereon. However, in case that particles and the like exist on and/or over the insulating interlayer around or on the contact area, the contact hole fails to be formed to expose the lower metal line sufficiently or is formed to partially expose the lower metal line. Therefore, if the contact hole fails to be formed completely, the metal line is open to cause malfunction to the semiconductor device. Moreover, contact resistance is increased to reduce an operational speed of the semiconductor device.

SUMMARY

Embodiments relate to a method of fabricating a metal line in a semiconductor device for preventing contact failure by forming a metal line without forming a via-contact.

Embodiments relate to a metal line in a semiconductor device and fabricating method thereof by which contact failure is prevented in a manner of forming a lower metal line and a lower metal line together in a modular structure.

Embodiments relate to a metal line in a semiconductor device and fabricating method thereof by which resistance of a metal line can be reduced to maximize the operational speed in a manner of forming a lower metal line and a lower metal line together in a modular structure.

Embodiments relate to a method of fabricating a metal line in a semiconductor device that may include at least one of the following steps: forming a protective layer on and/or over a semiconductor substrate, and then forming a first contact plug on and/or over the protective layer, and then sequentially forming a first insulating interlayer and a first etch stopper layer on and/or over the substrate including the first contact plug, and then forming a trench by removing the first insulating interlayer and the first etch stopper layer to expose the first contact plug, and then depositing a metal layer on and/or over the substrate including the trench, and then simultaneously forming a metal line in the trench and a second contact plug projecting from the trench in a modular structured by etching the metal layer using the etch-stopper layer, and then depositing a second insulating interlayer on and/or over the substrate including the second contact plug, and then performing CMP until the second contact plug is exposed.

Embodiments relate to a metal line in a semiconductor device that may include at least one of the following: a first contact plug on and/or over a substrate, a first insulating interlayer and a first etch stopper layer sequentially stacked on and/or over the substrate including the first contact plug, a trench in the first insulating interlayer and the first etch stopper layer, a metal line layer in the trench, the metal line layer including a second contact plug projected from the trench, and a second insulating interlayer on and/or over the substrate including the metal line having the second contact plug.

Embodiments relate to a metal line in a semiconductor device that may include at least one of the following: a first contact plug on a substrate; a first insulating interlayer over the substrate including the first contact plug; a first etch stop layer formed over the first insulating interlayer; a trench in the first insulating interlayer and the first etch stopper layer; a metal line in the trench, the metal line including a second contact plug projecting from the trench such that the metal line and the trench are formed as a single body; and a second insulating interlayer over the substrate including the metal line and the second contact plug.

Embodiments relate to a method that may include at least one of the following steps: forming a protective layer over a semiconductor substrate; and then forming a first contact plug extending through the protective layer; and then sequentially forming a first insulating interlayer and a first etch stop layer over the protective layer including the first contact plug; and then forming a trench extending through the first insulating interlayer and the first etch stop layer to expose the first contact plug; and then sequentially forming a first barrier metal layer, a metal layer and a second barrier metal layer over the entire semiconductor substrate including the protective layer, the first contact plug, the first etch stop and sidewalls and a bottom surface of the trench; and then simultaneously forming a metal line in the trench and a second contact plug extending from the metal line and projecting from the trench.

Accordingly, in accordance with embodiments, multilayer metal lines are formed in a manner of depositing a metal layer for forming a metal line and then etching the metal layer selectively to simultaneously form a metal line and a contact plug together in one body. Therefore, contact failure between metal lines is prevented. And, contact resistance between a metal line and a contact plug is minimized to enhance an operational speed of a semiconductor device.

DRAWINGS

Example FIGS. 1A to 1D illustrate a method of fabricating a metal line in a semiconductor device.

Example FIGS. 2A to 2G illustrate a method of fabricating a metal line in a semiconductor device in accordance with embodiments.

DESCRIPTION

Reference will now be made in detail to a method of forming a metal line in a semiconductor device in accordance with embodiments, examples of which are illustrated in the accompanying example drawing figures. Wherever possible, the same reference numbers will be used throughout the example drawing figures to refer to the same or like parts.

Figure 2A:
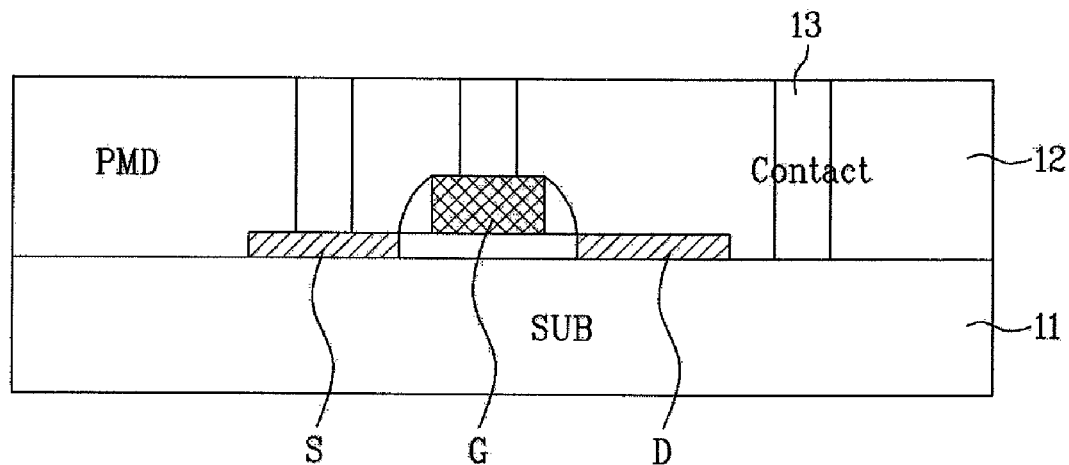

As illustrated in example FIG. 2A, after a semiconductor device such as a photodiode, a transistor, a capacitor and the like has been formed on and/or over semiconductor substrate 11, protective layer 12 is deposited on and/or over semiconductor substrate 11. A MOS transistor including gate electrode G, source S and drain D is illustrated as the semiconductor device. Subsequently, protective layer 12 is selectively removed by photolithography to form contact holes. After a metal layer (e.g., tungsten layer) has been formed on and/or over protective layer 12 to fill the contact holes, first contact plugs 13 including the metal layer is formed in each of the contact holes by CMP. First contact plugs 13 can have a structure that a barrier metal layer and a metal layer are stacked in the contact holes.

Figure 2B:
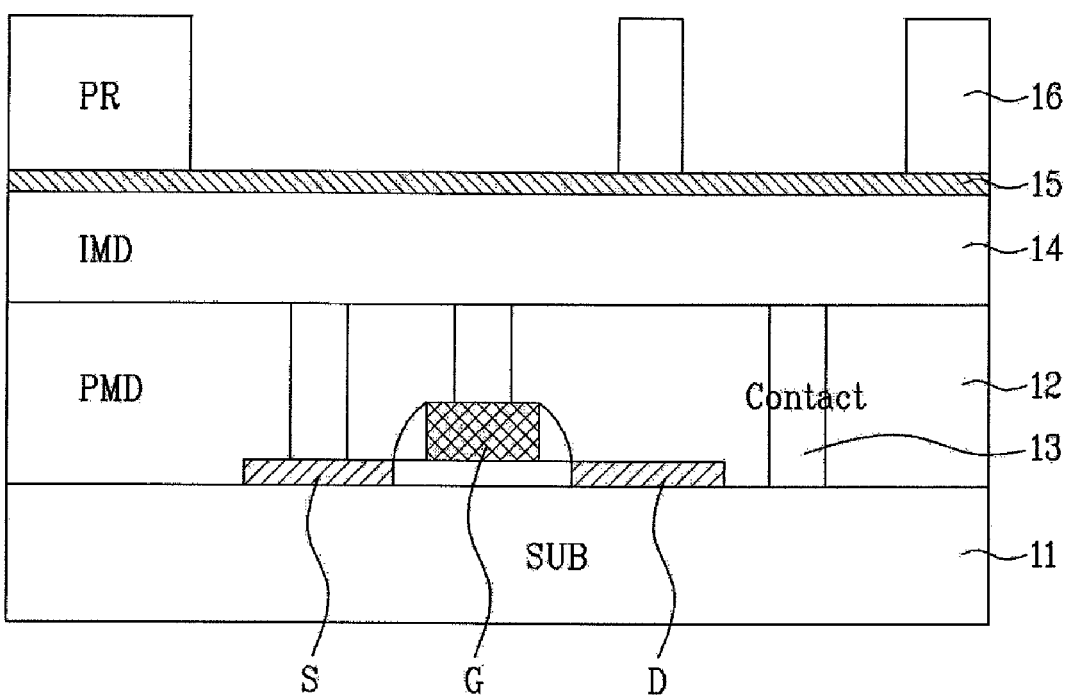

As illustrated in example FIG. 2B, first insulating interlayer 14 composed of undoped silicate glass (USG) and first silicon nitride layer 15 are sequentially formed on and/or over protective layer 12 including first contact plugs 13. A photoresist film is formed on and/or over first silicon nitride layer 15 and then patterned by photolithography to form first photoresist patterns 16 exposing portions of silicon nitride layer 15 corresponding to an area for forming a lower metal line. For instance, first photoresist pattern 16 exposes a first area corresponding to a portion of first silicon nitride layer 15. Assuming that a portion of first silicon nitride layer 15 corresponding to first contact plugs 13 is named a second area, the first area includes the second area. For instance, the first area includes the second area and is able to further include a neighbor area of the second area.

Figure 2C:
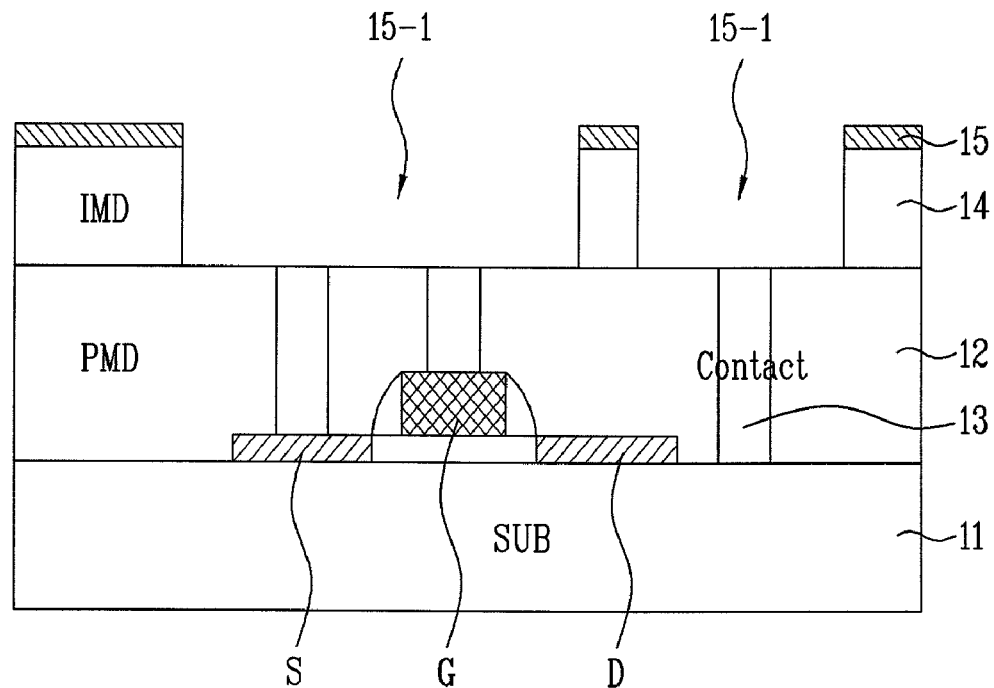

As illustrated in example FIG. 2C, trench 15-1 is formed to expose first contact plugs 13 in a manner of selectively removing first silicon nitride layer 15 and first insulating interlayer 14 selectively using first photoresist pattern 16 as a mask. The remaining first photoresist pattern 16 is then removed. For instance, by etching first silicon nitride layer 15 in the exposed first area and first insulating interlayer 14 beneath first silicon nitride layer 15 using first photoresist pattern 16 as a mask, trench 15-1 is formed exposing first contact plugs 13.

Figure 2D:
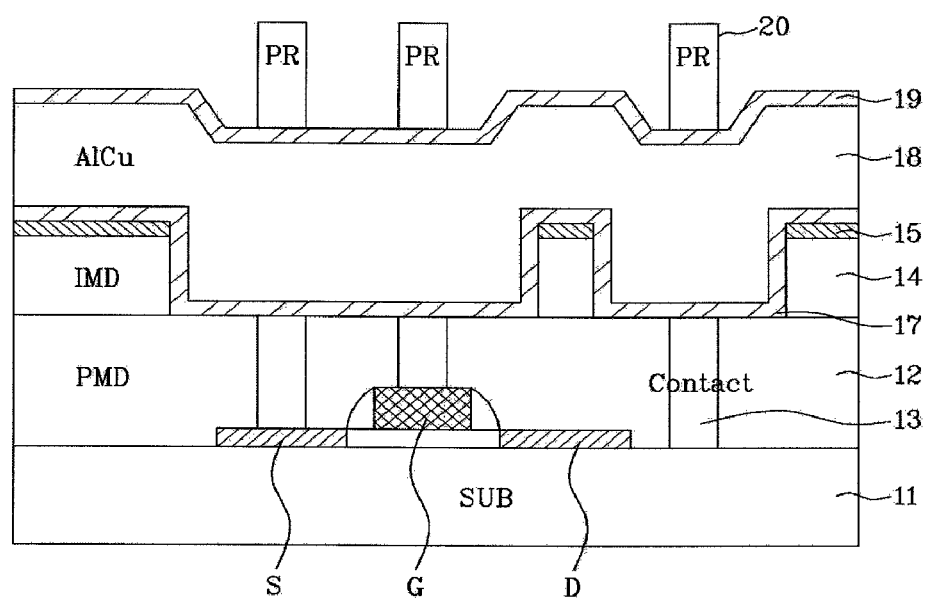

As illustrated in example FIG. 2D, first barrier metal layer 17 is deposited on and/or over the entire semiconductor substrate 11 including protective layer 12, first contact plugs 13, first silicon nitride layer 15 and sidewall and bottom surfaces of trench 15-1. Subsequently, metal layer 18 for forming a metal line is deposited on protective layer 12 semiconductor substrate 11 including first barrier metal layer 17 filling trench 15-1. Metal layer 18 for forming the metal line has a step difference due to the step difference of first insulating interlayer 14 in which trench 15-1 is formed. For instance, a thickness of metal layer 18 formed in the area for forming trench 15-1 is greater than that of metal layer 18 formed on and/or over first insulating interlayer 14 in which trench 15-1 is not formed. Subsequently, second barrier metal layer 19 is deposited on and/or over metal layer 18. Second barrier metal layer 19 has a profile difference similar to that of uppermost surface of metal layer 18. A photoresist film is formed on and/or over second barrier metal layer 19 and then patterned by photolithography to form second photoresist patterns 20 on and/or over second barrier metal layer 19 corresponding to the area for forming a second contact plug only by exposing the remaining portion. For instance, second photoresist pattern 20 can be formed to cover one portion of second barrier metal layer 19 corresponding to the first contact plug and to expose the remaining portion of second barrier metal layer 19. Each of first and second barrier metal layers 17 and 19 may be formed of at least one of titanium (Ti), titanium nitride or alloys thereof. Metal layer 18 for the metal line can be formed of at least one of aluminum (Al), Al alloys, copper (Cu), Cu alloys and Cu—Al alloys.

Figure 2E:
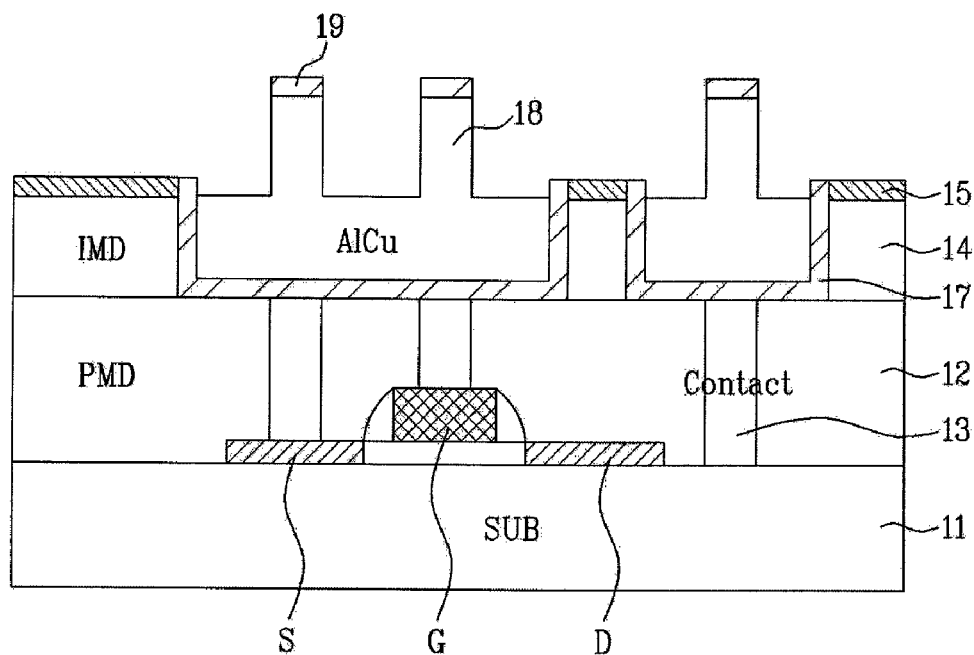

As illustrated in example FIG. 2E, using second photoresist patterns 20 as an etch mask, second barrier metal layer 19, metal layer 18 and first barrier metal layer 17 are selectively removed. Using first silicon nitride layer 15 as an etch stop, second barrier metal layer 19, metal layer 18 and first barrier metal layer 17 are selectively etched away to expose a surface of first silicon nitride layer 15. Since metal layer 18 has the step difference, metal layer 18 remains by being embedded in trench 15-1 after the etch process using second photoresist pattern 20 as the etch mask.

Figure 2F:
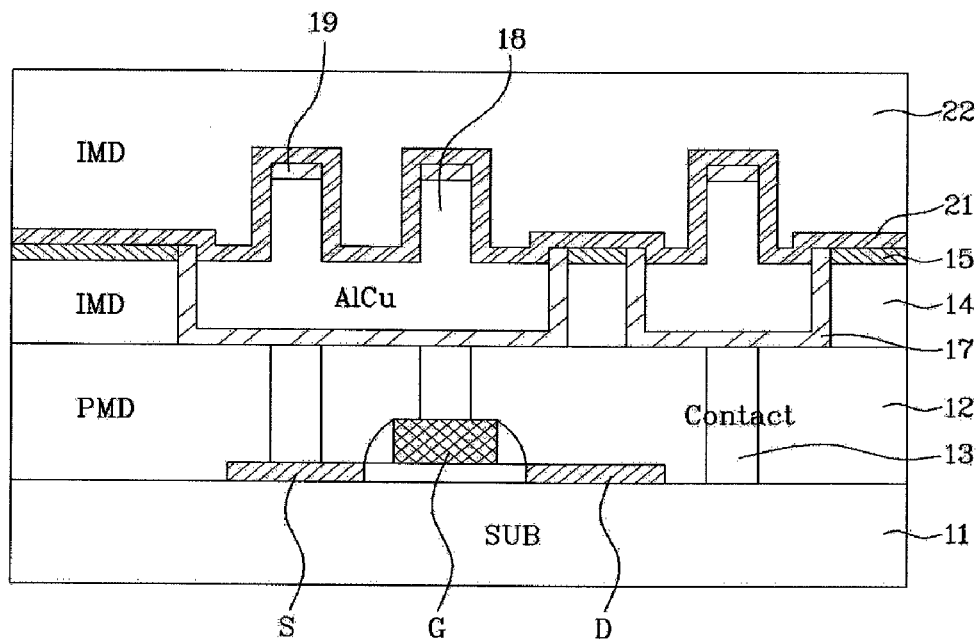

As illustrated in example FIG. 2F, second photoresist pattern 20 is removed and second silicon nitride layer 21 is then deposited on and/or over the entire substrate 11 including first silicon nitride layer 15, second barrier metal layer 19, metal layer 18 and first barrier metal layer 17. Subsequently, second insulating interlayer 22 is deposited on and/or over second silicon nitride layer 21.

Figure 2G:
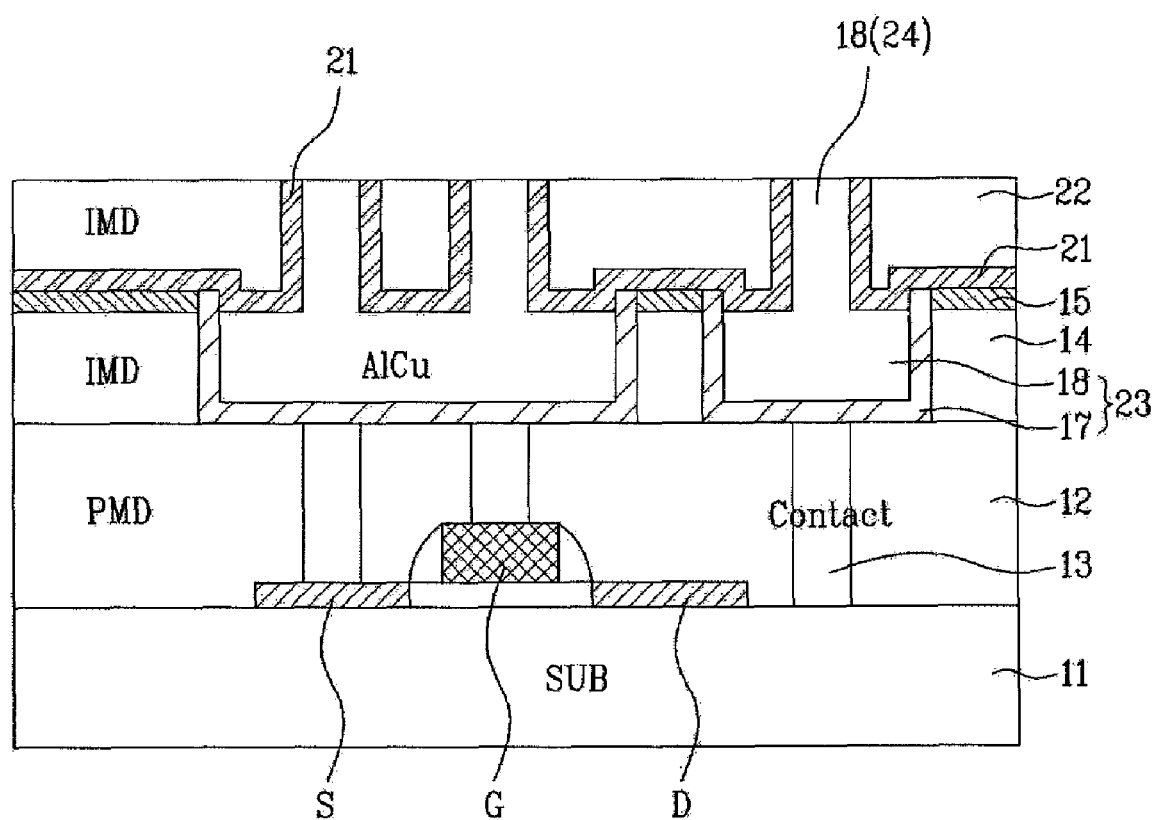

As illustrated in example FIG. 2G, second silicon nitride layer 21 is exposed by planarizing second insulating interlayer 22 by CMP. Second barrier metal layer 19 is then exposed by planarizing the exposed second silicon nitride layer 21 and second insulating interlayer 22. Subsequently, the exposed barrier metal layer 19 and second insulating interlayer 22 is continuously planarized until the metal layer for forming metal line 18 is exposed. The exposed metal layer 18 is formed over trench 15-1 to correspond to second photoresist pattern 20, which is second contact plug 24. Subsequently, multi-layer metal lines can be formed by repeating the steps illustrated in example in FIGS. 2C and 2G.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a metal line in a semiconductor device comprising:
    forming a protective layer over a semiconductor substrate; and then
    forming a first contact plug in the protective layer; and then
    sequentially forming a first insulating interlayer and a first etch stop layer over the semiconductor substrate including the first contact plug; and then
    forming a trench by removing the first insulating interlayer and the first etch stopper layer to expose the first contact plug; and then
    forming a metal layer over the semiconductor substrate including the trench; and then
    simultaneously forming a metal line in the trench and a second contact plug extending from the metal line and projecting the trench by etching the metal layer; and then
    forming a second etch stop layer comprising silicon nitride directly contact the metal line and the second contact plug after simultaneously forming the metal line and the second contact plug; and then
    depositing a second insulating interlayer over the semiconductor substrate including the second contact plug; and then
    performing CMP until the second contact plug is exposed.

2. The method of claim 1, wherein the first and second etch stopper layers comprises a silicon nitride layer.

3. The method of claim 1, wherein the metal layer in the trench is formed thicker than the metal layer over the first insulating interlayer.

4. The method of claim 1, wherein forming the metal layer comprises sequentially stacking a first barrier metal layer, a metal line layer and a second barrier metal layer.

5. The method of claim 4, wherein the first and second barrier metal layers is formed of one selected from the group consisting of titanium, titanium nitride and alloys thereof.

6. The method of claim 4, wherein the metal line layer is formed of one selected from the group consisting of aluminum (Al), Al alloys, copper (Cu), Cu alloys and Cu—Al alloys.

7. The method of claim 1, wherein forming the trench comprises:
    forming a first photoresist pattern over the first etch stop layer to expose a first area; and then
    etching the first etch stop layer and the first insulating interlayer using the first photoresist pattern as an etch mask; and then
    removing the first photoresist pattern,
    wherein the first area includes a second area corresponding to the first contact plug and an area adjacent to the second area.

8. The method of claim 1, wherein simultaneously forming the metal line and the second contact plug comprises:
    forming a second photoresist pattern covering an area of the metal layer corresponding to an area for forming the second contact plug to expose the remaining metal layer; and then
    forming the second contact plug by etching the metal layer to expose the etch stop layer using the second photoresist pattern as a mask.

9. The method of claim 8, wherein forming the second photoresist pattern comprises: forming the second photoresist pattern covering one area of the metal layer corresponding to the first contact plug to expose the remaining area of the metal layer.

10. A method comprising:
    forming a protective layer over a semiconductor substrate; and then
    forming a first contact plug extending through the protective layer; and then
    sequentially forming a first insulating interlayer and a first etch stop layer over the protective layer including the first contact plug; and then
    forming a trench extending through the first insulating interlayer and the first etch stop layer to expose the first contact plug; and then
    sequentially forming a first barrier metal layer, a metal layer and a second barrier metal layer over the entire semiconductor substrate including the protective layer, the first contact plug, the first etch stop and sidewalls and a bottom surface of the trench; and then
    simultaneously forming a metal line in the trench and a second contact plug extending from the metal line and projecting from the trench; and then
    forming a second etch stop layer comprising silicon nitride directly contact the metal line and the second contact plug after simultaneously forming the metal line and the second contact plug.

11. The method of claim 10, wherein the metal line and the second contact plug is formed of one selected from the group consisting of aluminum (Al), Al alloys, copper (Cu), Cu alloys and Cu—Al alloys.

* * * * *